(12) United States Patent
Sakai

(10) Patent No.: US 9,728,561 B1
(45) Date of Patent: Aug. 8, 2017

(54) PIXEL STRUCTURE FOR AN ELECTRONIC DISPLAY

(71) Applicant: Amazon Technologies, Inc., Seattle, WA (US)

(72) Inventor: Toru Sakai, Waalre (NL)

(73) Assignee: Amazon Technologies, Inc., Seattle, WA (US)

( * ) Notice: Subject to any disclaimer, the term of this patent is extended or adjusted under 35 U.S.C. 154(b) by 190 days.

(21) Appl. No.: 14/869,692

(22) Filed: Sep. 29, 2015

Related U.S. Application Data

(60) Provisional application No. 62/191,252, filed on Jul. 10, 2015.

(51) Int. Cl.

| | |
|---|---|
| H01L 27/13 | (2006.01) |
| H01L 27/12 | (2006.01) |
| H01L 29/786 | (2006.01) |
| H01L 21/02 | (2006.01) |
| H01L 29/66 | (2006.01) |
| G02F 1/1368 | (2006.01) |
| G02F 1/1362 | (2006.01) |
| G02F 1/1333 | (2006.01) |
| G02B 26/00 | (2006.01) |
| G02F 1/167 | (2006.01) |

(52) U.S. Cl.
CPC ........ *H01L 27/1255* (2013.01); *G02B 26/005* (2013.01); *G02F 1/1368* (2013.01); *G02F 1/133345* (2013.01); *G02F 1/136213* (2013.01); *G02F 1/136227* (2013.01); *G02F 1/167* (2013.01); *H01L 21/0217* (2013.01); *H01L 21/02532* (2013.01); *H01L 21/02592* (2013.01); *H01L 27/124* (2013.01); *H01L 27/1222* (2013.01); *H01L 27/1259* (2013.01); *H01L 29/66765* (2013.01); *H01L 29/78669* (2013.01)

(58) Field of Classification Search
CPC ................................................... H01L 27/1255
See application file for complete search history.

(56) References Cited

U.S. PATENT DOCUMENTS

| | | | | |
|---|---|---|---|---|
| 9,563,052 | B2* | 2/2017 | Aubert | G02B 26/004 |
| 2008/0118743 | A1* | 5/2008 | Lee | C23C 14/042 |
| | | | | 428/332 |
| 2011/0193475 | A1* | 8/2011 | Kim | H01L 27/3251 |
| | | | | 313/504 |
| 2014/0218785 | A1* | 8/2014 | Aubert | G02B 26/004 |
| | | | | 359/290 |

* cited by examiner

*Primary Examiner* — Robert Bachner
*Assistant Examiner* — Molly Reida
(74) *Attorney, Agent, or Firm* — Lee & Hayes, PLLC

(57) ABSTRACT

A method for fabricating a stacked thin film transistor (TFT) structure comprises: forming at least two TFTs on a substrate of a display device; at least partially covering the at least two TFTs with an insulating layer; forming a common electrode on the insulating layer and the at least two TFTs; covering, at least partially, the common electrode with a dielectric material, wherein the insulating layer, the common electrode, and the dielectric material each include a contact hole; filling, at least partially, the contact hole with a conductive material; and depositing the conductive material over the dielectric material to form a pixel electrode.

20 Claims, 13 Drawing Sheets

PIXEL STRUCTURE FOR AN ELECTRONIC DISPLAY

CROSS REFERENCE TO RELATED APPLICATIONS

This disclosure claims priority to U.S. Provisional Patent Application No. 62/191,252, filed on Jul. 10, 2015, which is incorporated herein by reference in its entirety.

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, finding ways to enhance user experience and satisfaction continues to be a priority. Moreover, increased multimedia use imposes high demands on designs, packaging, and fabricating display devices, as content available for mobile use becomes more extensive and device portability continues to be a high priority.

Electrophoretic displays, such as electronic ink (e-ink) displays (also referred to as electronic paper displays), employ an array of microcapsules filled with charged pigment particles, the microcapsules providing an image displayed by addressing pixels. Altering the displayed image involves applying an electric field to the microcapsules to alter the color state of each pixel and thus form the image. For example, in a black-and-white electronic paper display, various positive or negative voltages may be applied to the microcapsules to adjust a color or brightness state of each pixel along a grayscale from white to black to achieve the desired image.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
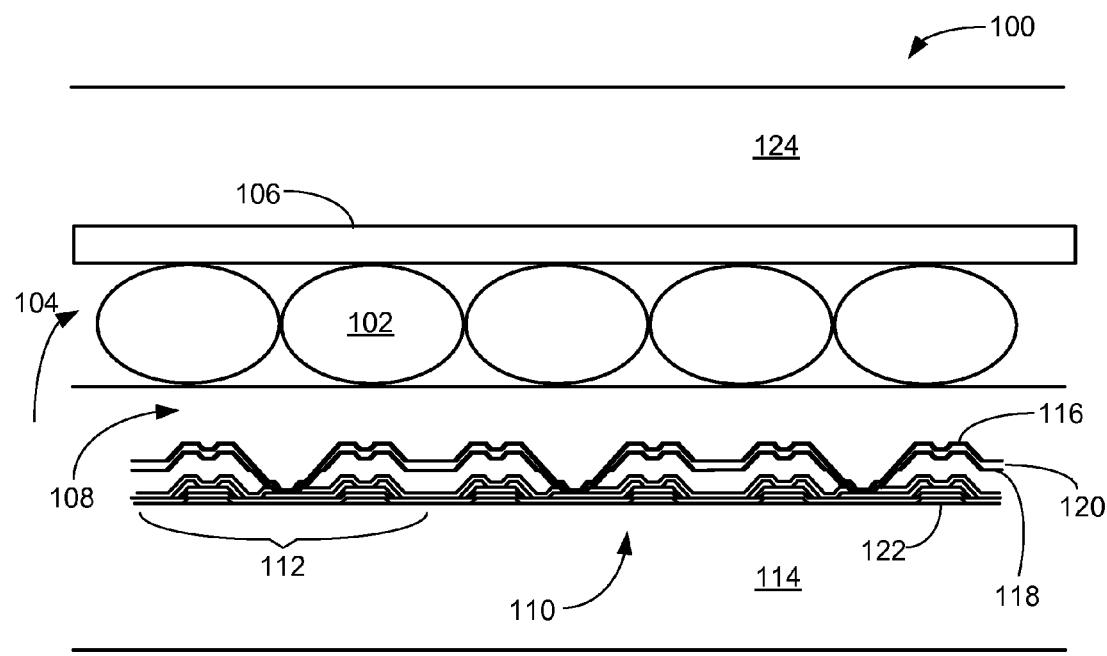
FIG. 1 is a cross-section view of a portion of an electrophoretic display that includes several electrophoretic pixels, according to some embodiments.

In various embodiments described herein, electronic devices include electrophoretic displays (EPD) for presenting content and other information. In some examples, the electronic devices may include one or more components associated with the electrophoretic display, such as a touch sensor component layered atop the EPD for detecting touch inputs, and/or a cover layer component, which may include antiglare properties, antireflective properties, anti-fingerprint properties, anti-cracking properties, and the like. Various embodiments described herein include structures that may be included in EPDs and techniques for fabricating such structures. Though the embodiments are directed, as examples, toward EPDs, such embodiments may, at least in part, be applied to other types of displays or devices, and claimed subject matter is not limited.

In some embodiments, an EPD having relatively high resolution may include pixels each formed within a footprint having relatively small outer dimensions, such as 50 μm×50 μm (microns), though pixels need not be square shaped. A pixel of an EPD may have various characteristics, such as relatively low leakage current through a TFT(s) of the pixel and relatively low pixel voltage degradation during a hold period (e.g., a period during which the pixel maintains an optical state, such as for a static image displayed by the EPD).

In various embodiments, individual pixels of an EPD may include a storage capacitor and two thin film transistors (TFTs) connected together in a series configuration. A TFT is a particular type of field-effect transistor that may include thin films of an active semiconductor layer as well as a dielectric layer and metallic contacts, for example.

In some cases, due to relatively small outer dimensions of a footprint of a pixel of a high resolution EPD, fabrication of the above-mentioned pixel configuration (e.g., two TFTs and a storage capacitor, among other things) may present some challenges. Embodiments described here address these challenges.

A pixel of a display device may have a 3D structure. For example, in the case of an EPD, instead of two TFTs of a pixel being in the same plane, the two TFTs, though they may still be substantially in a plane, may be part of a stacked structure that is electrically interconnected with (other portions of) the pixel. The 3D structure may provide a more efficient use of space (e.g., smaller footprint) as compared to a planer structure, for example. Process steps for fabricating such a pixel structure (or a portion thereof) are described below.

In some embodiments, a pixel of a display device, such as an EPD, an electrowetting display (EWD), or liquid crystal display (LCD), just to name a few examples, may include a common electrode between a TFT (or two TFTs) and a pixel electrode such as a storage capacitor. Herein, a common electrode may be an electrode that provides common potential (common voltage) to a plurality of storage capacitors within the plurality of pixels of the display device. A pixel electrode may be an electrode of individual, respective pixels, wherein the electrode provides signal potential (signal voltage) to the medium (e.g., electrophoretic particles, LC material, electrowetting fluids, etc.) between a pixel electrode and a counter electrode having a common potential for all pixels The voltage applied to the medium may be the difference between signal potential and common potential, which may result in an optical effect (e.g., light transmission, reflection, or both) of the medium.

The pixel may further include an insulation layer stack between the common electrode and a drain of the TFT. A pixel electrode, atop the insulation layer stack and the common electrode, may be electrically connected through a contact hole in the common electrode and the insulation layer stack. The contact hole may be at least partially filled with an electrically conductive material (e.g., the same material as the pixel electrode), thus forming a contact path between the drain of the TFT and the pixel electrode. The contact path may be, in a top or plan view, in the middle region of the pixel. Such a configuration may allow for a relatively large area of the common electrode.

In some embodiments, the surface of the insulation layer stack, which may include a stacked inorganic layer and an organic layer, may have a topology that corresponds to the configuration described above. This topology may allow for a relatively large area for a storage capacitance formed, in part, by the common electrode and the pixel electrode. According to the topology and structure described above, a capacitor (e.g., the storage capacitance) may be placed above the TFT. In some embodiments, a second TFT may be adjacent and substantially in the same plane as the TFT. The common electrode may encapsulate the TFT's. This may provide a benefit where the common electrode may decouple any fringing fields between the TFTs and the pixel electrode.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrophoretic display based, at least in part, on electronic signals representative of image or video data. The code may cause the processor to modulate the optical properties of pixels by controlling electrical signals (e.g., voltages, currents, fields, and so on) on, over, or in layers of the electrophoretic display.

FIG. 1 is a cross-section view of a portion of an EPD 100 that includes several electrophoretic pixels, according to some embodiments. In particular, EPD 100 includes microcapsules 102 in a binder 104 disposed between a front electrode 106 and a lamination adhesive material 108. A TFT array plate 110 may be laminated to the structure that includes the microcapsules and binder by lamination adhesive material 108. Elements in FIG. 1 are not necessarily drawn to scale with respect to one another. For example, the thickness of the TFT layers is exaggerated to illustrate the structure.

TFT array plate 110 may include an array of TFT stack structures 112, which are described in detail below. TFT stack structures 112, which may be disposed on a support plate 114, for example, may include a pixel electrode 116, a common electrode 118, and a dielectric layer 120 therebetween. As explained below, pixel electrode 116, common electrode 118, and dielectric layer 120 collectively form a capacitor, such as a storage capacitor. Gates 122 of TFT stack structures 112 may be separated from such capacitors (e.g., each TFT stack structure having one capacitor) by, among other things, various organic and inorganic insulating layers (illustrated but not labelled in FIG. 1), as described in detail below. In some implementations, a top substrate 124 may comprise a transparent material such as glass or polymer material, just to name a few examples.

Figure 2:
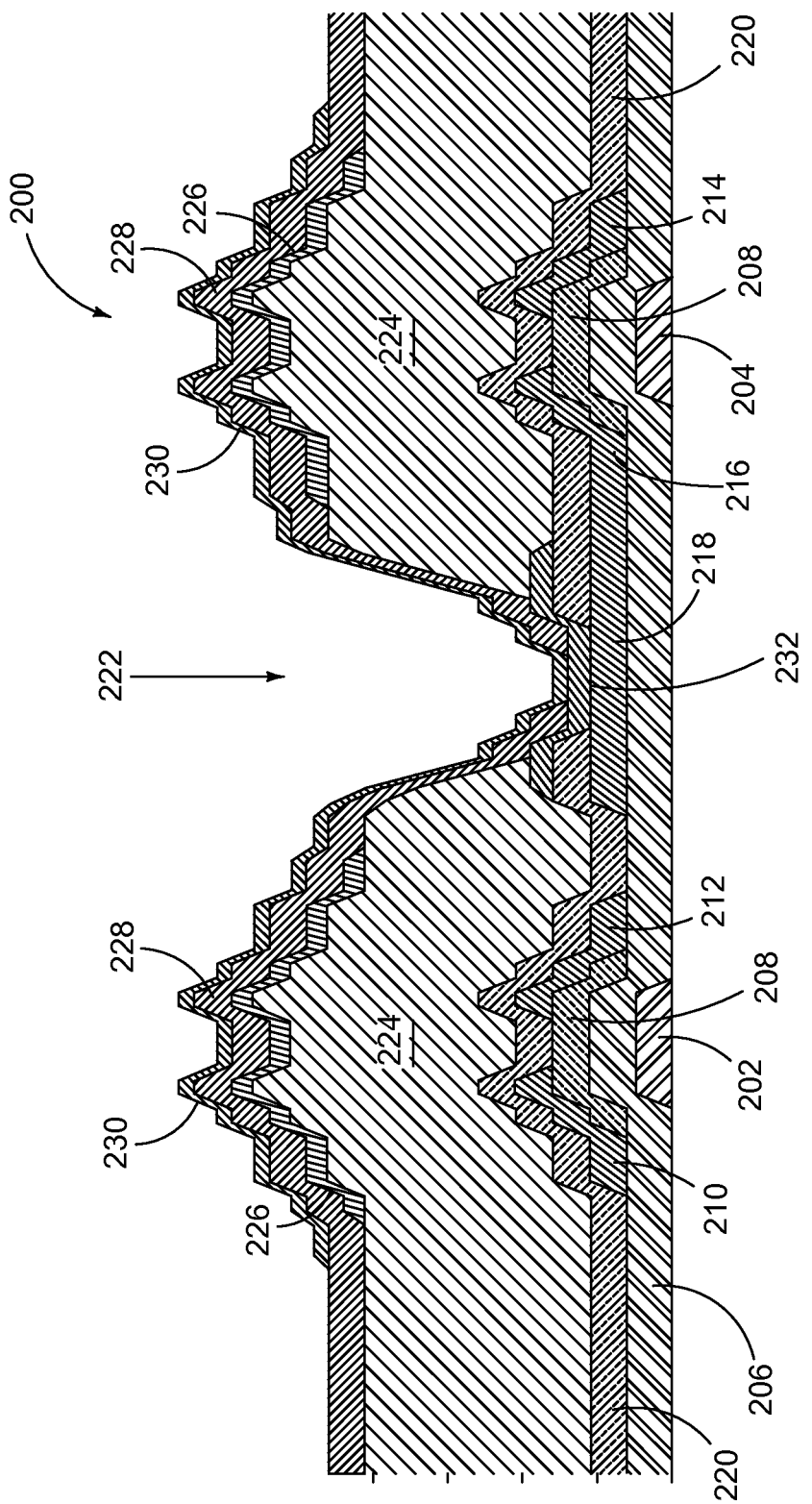
FIGS. 2 and 3 are cross-section views of TFT stack structures for an electrophoretic pixel, according to some embodiments.

FIG. 2 is a cross-section view of a TFT stack structure 200 for a pixel, such as for an electrophoretic pixel, according to some embodiments. Though reference is made for an EPD, TFT stack structure 200 may be incorporated in any of a number of types of display devices. Further, the described subject matter is not limited to display devices or any particular type of display device.

TFT stack structure 200 may similar to or the same as TFT stack structure 112, illustrated in FIG. 1, for example. A center region (e.g., corresponding to a center region of the pixel) includes a recess or via (e.g., contact hole 222) through several layers in TFT stack structure 200. It is through this via that an electrical contact is made between two electrodes (e.g., pixel electrode and drain of a TFT). Top portions of TFT stack structure 200 correspond to a capacitor, described below. In a top view, the shape of this capacitive structure is disk-like, with a central contact hole (e.g., 222), for example.

TFT stack structure 200 comprises two TFTs and a capacitor. A gate structure, which comprises a gate 202 of the first TFT and a gate 204 of the second TFT (labels "first" and "second" are arbitrary), are covered by an insulation layer 206, which may comprise silicon nitride, for example. An active layer 208, such as amorphous silicon may cover a portion of insulation layer 206 over gates 202 and 204. A source 210 and a drain 212 of first TFT are disposed above a plane defined by gates 202 and 204. A source 214 and a drain 216 of second TFT are also disposed above the plane. A contact region 218 is electrically connected to drain 216. In some implementations, contact region 218 and drain 216 may be a single element (e.g., formed at the same time and of the same material).

An insulation layer 220, which may comprise silicon nitride, for example, may cover the drains and sources of both TFTs. As described below, a contact hole 222 in insulation layer 220 may expose at least a portion of contact region 218 to subsequent layers in the TFT stack structure 200. Contact hole 222, which may be approximately several microns across, may have any of a number of shapes, such as round, rectangular, square and so on. An organic insulation layer 224 may cover insulation layer 220. Organic insulation layer 224 also includes contact hole 222.

A common electrode 226, which may be the same as or similar to 118 illustrated in FIG. 1, for example, may cover a portion of organic insulation layer 224. Common electrode 226 includes contact hole 222. A dielectric layer 228, which also includes contact hole 222, may cover common electrode 226. A pixel electrode 230, which may be the same as or similar to 116 illustrated in FIG. 1, for example, may cover a portion of dielectric layer 228. Pixel electrode 230, common electrode 226, and dielectric layer 228 collectively form a capacitor.

Pixel electrode 230 may extend into contact hole 222 and electrically contact the contact region 218 via an electrically conductive layer 232, which may be a metal, for example. In some implementations, a support plate 234 may act as a substrate for TFT stack structure 200. In some embodiments, support plate 234 and TFT stack structure 200 may comprise a stand-alone structure that need not be part of a display device. In other embodiments, for example, support plate 234 need not be part of TFT stack structure 200, which may be implemented in any of a number of types of electronic devices.

In some implementations, gates 202 and 204, active layer 208, sources 210 and 214, drains 212 and 216, contact region 218, dielectric layer 228, and insulation layer 220 may each have a thickness of approximately 250 nanometers. Insulation layer 206 may have a thickness of approximately 300 nanometers. Common electrode 226 and electrically conductive layer 232 may each have a thickness of approximately 150 nanometers. Organic insulation layer 224 may have a thickness in a range of approximately 1.5 to 2.5 microns. Pixel electrode 230 may have a thickness in a range of approximately 80 to 120 nanometers.

Figure 3:
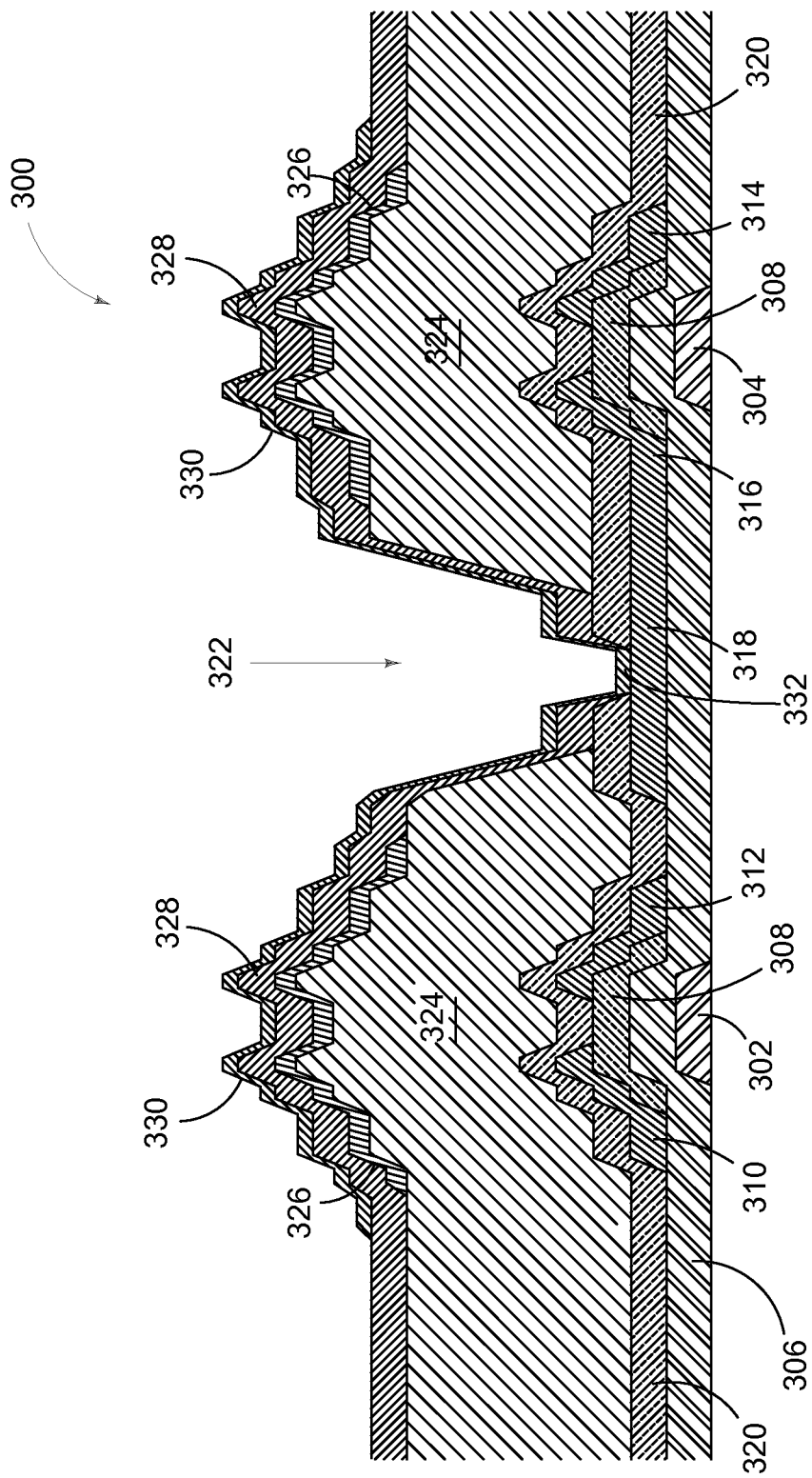

FIG. 3 is a cross-section view of a TFT stack structure 300 for a pixel, such as for an electrophoretic pixel, according to some embodiments. Though reference is made for an EPD, TFT stack structure 300 may be incorporated in any of a number of types of display devices. As stated above, the described subject matter is not limited to display devices or any particular type of display device.

TFT stack structure 300 is similar to TFT stack structure 200, except that the pixel electrode directly contacts the contact region, sans electrically conductive layer 232, for example.

TFT stack structure 300 comprises two TFTs and a capacitor. A gate 302 of the first TFT and a gate 304 of the second TFT are covered by an insulation layer 306, which may comprise silicon nitride, for example. An active layer 308, such as amorphous silicon, may cover a portion of insulation layer 306 over gates 302 and 304. A source 310 and a drain 312 of first TFT are disposed above a plane defined by gates 302 and 304. A source 314 and a drain 316 of second TFT are also disposed above the plane. A contact region 318 is electrically connected to drain 316. In some implementations, contact region 318 and drain 316 may be a single element (e.g., formed at the same time and of the same material).

An insulation layer 320, which may comprise silicon nitride, for example, may cover the drains and sources of both TFTs. As described below, a contact hole 322 in insulation layer 320 may expose at least a portion of contact region 318 to subsequent layers in the TFT stack structure 300. Contact hole 322, which may be approximately several microns across, may have any of a number of shapes, such as round, rectangular, square and so on. Contact hole 322 need not have the same shape or size as contact hole 222. An organic insulation layer 324 may cover insulation layer 320. Organic insulation layer 324 also includes contact hole 322.

A common electrode 326, which may be the same as or similar to 118 illustrated in FIG. 1, for example, may cover a portion of organic insulation layer 324. Common electrode 326 includes contact hole 322. A dielectric layer 328, which also includes contact hole 322, may cover common electrode 326. A pixel electrode 330, which may be the same as or similar to 116 illustrated in FIG. 1, for example, may cover a portion of dielectric layer 328. Pixel electrode 330, common electrode 326, and dielectric layer 328 collectively form a capacitor.

Pixel electrode 330 may extend into contact hole 322 and electrically contact the contact region 318 via an electrically conductive layer 332, which may be a metal, for example. In some implementations, a support plate 332 may act as a substrate for TFT stack structure 300, though TFT stack structure 300 may be a stand-alone structure and need not include a substrate.

In some implementations, gates 302 and 304, active layer 308, sources 310 and 314, drains 312 and 316, contact region 318, dielectric layer 328, and insulation layer 320 may each have a thickness of approximately 250 nanometers. Insulation layer 306 may have a thickness of approximately 300 nanometers. Common electrode 326 and electrically conductive layer 332 may each have a thickness of approximately 150 nanometers. Organic insulation layer 324 may have a thickness of approximately 1500 nanometers. Pixel electrode 330 may have a thickness of approximately 100 nanometers.

Figure 4:
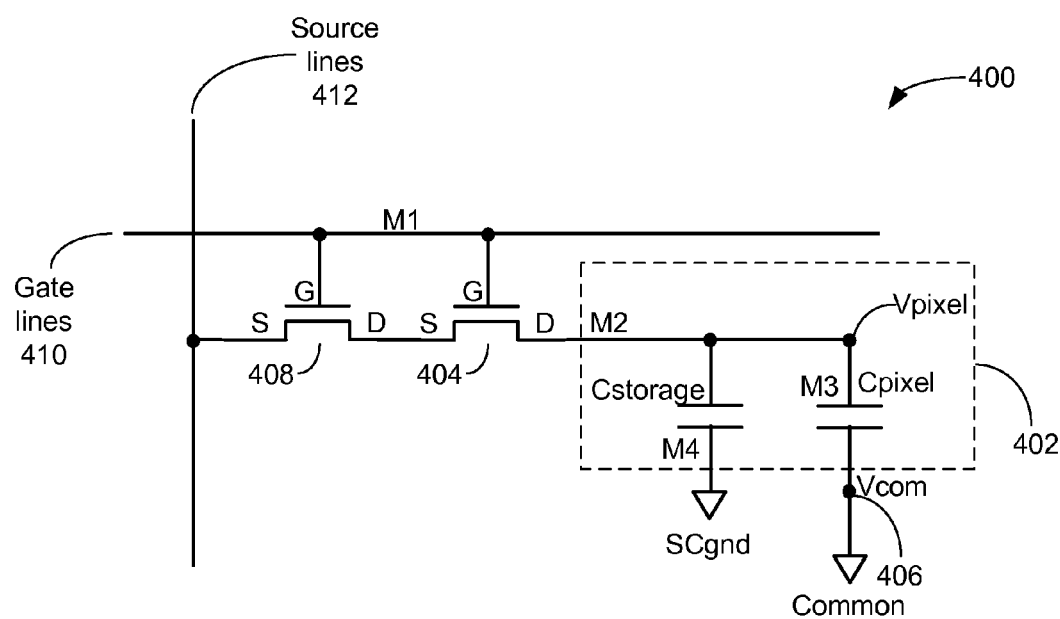
FIG. 4 is a schematic circuit diagram of an electrophoretic pixel, according to various embodiments.

FIG. 4 is a schematic circuit diagram of an electrophoretic pixel 400, according to various embodiments. The circuit includes a pixel portion 402 that includes the optical portion of electrophoretic pixel 400. Here, referring to the embodiment illustrated in FIG. 1, for example, such an optical portion includes, among other things, microcapsules 102. An electrical representation of the optical portion is shown in pixel portion 402. Capacitance Cpixel represents a capacitance formed by a multiple dielectric layer stack between a pixel electrode (e.g., pixel electrode 230) and a drain (e.g., drain 216) of TFT 404. Cstorage represents a storage capacitor formed by a pixel electrode (e.g., pixel electrode 230) and a common electrode (e.g., common electrode 226).

Vpixel is the voltage of pixel portion 402 with respect to a common voltage "point", Vcom 406 (though a portion of the electrophoretic element at the common voltage may be an extended region and need not be a point).

Electrophoretic pixel 400 includes two TFTs 404 and 408 connected to one another in series. TFTs 404 and 408 may be used, among other things, to select electrophoretic pixel 400 from an array of rows and columns of such electrophoretic pixels. In some implementations, Vpixel may be the voltage of the drain of TFT 404.

In some embodiments, pixel portion 402 may include multiple conductive layers which may, for example, be metal or a conductive semiconductor material. Three conductive layers of pixel portion 402 are referred to as M2, M3, and M4, respectively. M1 is located outside pixel portion 402 and may comprise a conductive layer corresponding to gates of TFT 404 and 408 for electrophoretic pixel 400. M2 may comprise a conductive layer(s) including the drain of TFT 404 and a contact region such as contact region 218, for example. M3 may comprise another conductive layer corresponding to a pixel electrode, such as pixel electrode 230. M4 may comprise another conductive layer corresponding to a common electrode, such as common electrode 226.

In some embodiments, pixel portion 402 is electrically connected to a display controller (e.g., 508 in FIG. 5) via TFTs 404 and 408. A ground voltage point of Cstorage, SCgnd may be electrically connected to the display controller in some examples.

The display device includes rows of gate lines 410 for selecting particular electrophoretic elements and columns of source lines 412 for electrically driving the selected electrophoretic elements. Gate lines 410 and source lines 412 may comprise conductive traces on a support plate (e.g., TFT array plate 110 or support plates 114 or 234). Gate line 410 may be electrically connected to the gates of TFTs 404 and 408 to select or deselect electrophoretic pixel 400. Source line 412 may be electrically connected to the source of TFT 408. The drain of TFT 408 may be connected to the source of TFT 404. The drain of TFT 404 may be electrically connected to pixel portion 402. In other implementations, different types of TFTs (e.g., n-type or p-type) may be used so that sources and drains may be reversed in the example descriptions herein. Claimed subject matter is not limited in this respect. Also, embodiments are described herein as having rows and columns of conductive lines (e.g., 410 and 412). However, the descriptions may include a switch between "rows" and "columns" without affecting the nature of such descriptions. Claimed subject matter is not limited in this respect.

Figure 5:
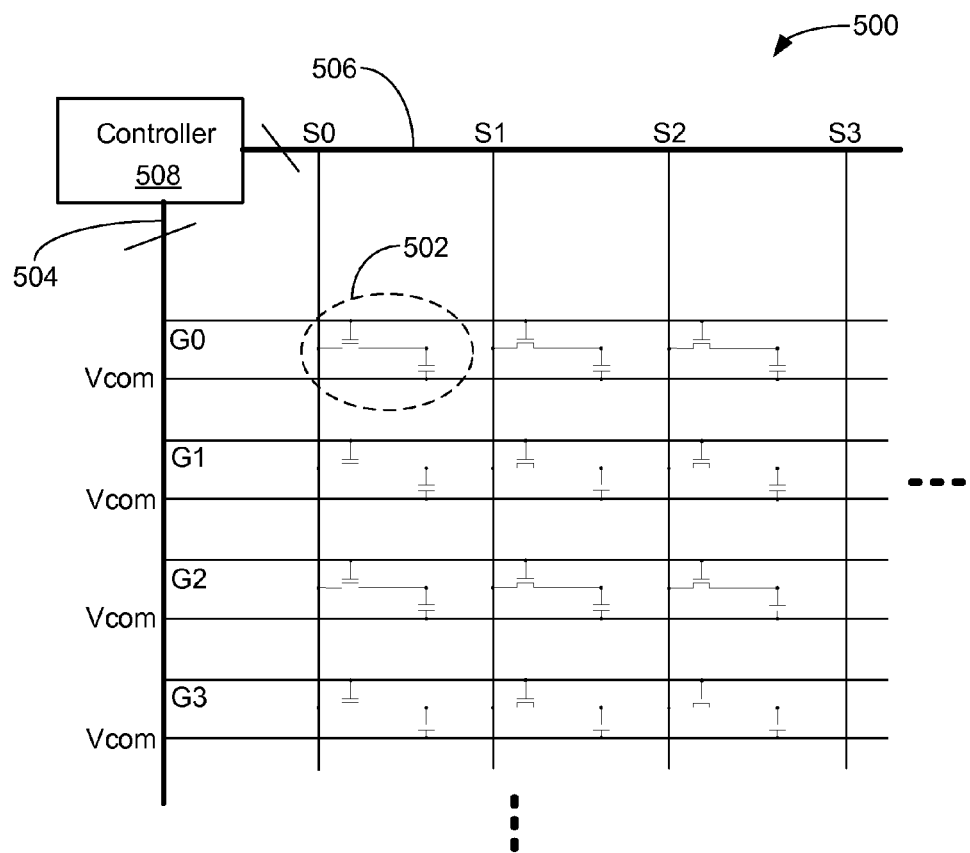
FIG. 5 is a schematic circuit diagram of a portion of an electrophoretic pixel array of an electrophoretic display, according to various embodiments.

FIG. 5 is a schematic circuit diagram of a portion of an electrophoretic pixel array of an electrophoretic display 500, according to various embodiments. Electrophoretic display 500 includes a plurality of electrophoretic pixels 502 arranged in rows and columns of a matrix. Each electrophoretic pixel 502 is illustrated schematically as including a single TFT and single capacitance. As explained above, however, each electrophoretic pixel 502 may include two TFTs having gates connected to gate lines, and may include more than one capacitor. For sake of clarity, a storage capacitor of each electrophoretic pixel, such as Cstorage illustrated in FIG. 4, is not included in FIG. 5, although this embodiment may include such storage capacitors.

In some examples, electrophoretic display 500 may include hundreds or thousands of such rows and columns of electrophoretic pixels 502. Electrophoretic pixels 502 may be similar to or the same as electrophoretic pixel 400 shown in FIG. 4. Electrophoretic pixels 502 are electrically connected in the matrix to rows of gate lines G0, G1, G2, G3 . . . , columns of source lines S0, S1, S2, S3 . . . , and rows of common voltage lines Vcom. Though Vcom lines are shown as rows, Vcom lines may instead be aligned in columns or any other configuration, and claimed subject matter is not so limited. The gate lines, source lines, and common voltage lines may be electrically connected to a plurality of conductors (e.g., wires, conductive traces, and so on) represented by lines 504 and 506 in FIG. 5. Such conductors and lines may be disposed substantially in a plane, such as in TFT array plate 110, for example.

Electrical signals (e.g., waveforms, voltage levels, and so on) are provided to the gate lines, source lines, and common voltage lines by a controller 508 via lines 504 and 506. In particular, common voltage lines Vcom may be electrically tied together and set to the same voltage. Controller 508 may be a processor, a CPU, or an ASIC, just to name a few examples. Functions of controller 508 may be implemented by software, hardware, or both. Controller 508 may affect optical transmission of the electrophoretic pixels 502 by increasing or decreasing voltage on the source lines and by generating signals on the other lines, for example.

In particular, individual electrophoretic pixels 502 may be electrically connected to (i) one of the source lines to provide a source signal to one of the two TFTs (e.g., TFT 408), (ii) one of the gate lines to provide a gate signal to both the TFTs, and (iii) one of the common voltage lines to provide a common voltage to the individual electrophoretic pixels 502.

Figure 6:
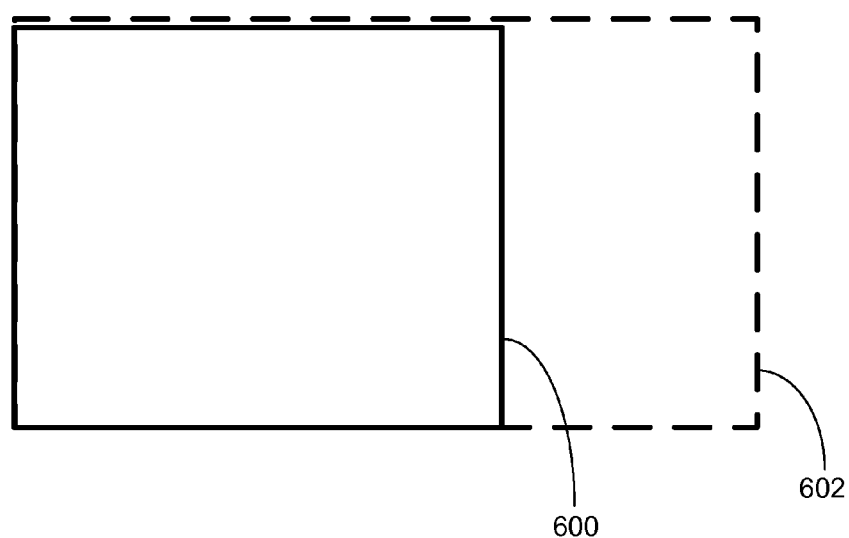
FIG. 6 is a schematic top view of the footprint of an electrophoretic pixel.

FIG. 6 is a schematic top view of the footprint of an electrophoretic pixel. In some embodiments, an EPD having relatively high resolution may include such pixels each formed within a footprint 600 having relatively small outer dimensions, such as 50 μm×50 μm (microns). A pixel of an EPD may include a storage capacitor and two thin film transistors (TFTs) connected together in a series configuration, such as that described above. To allow for relatively small outer dimensions of footprint 600, as compared to a footprint 602, for example, the pixel may have a 3D structure, such as TFT stack structure 200 or 300. For example, in the case of an EPD, instead of two TFTs and a storage capacitor of the pixel being in the same plane (which, for example, may lead to relatively large footprint 602), the TFTs and the storage capacitor may be part of a stacked structure. The 3D structure, in addition to a simpler fabrication process, may provide a more efficient use of space (e.g., smaller footprint 600) as compared to a planer structure, for example.

FIGS. 7-13 illustrate portions of an electrophoretic pixel at various stages of a process for fabricating the electrophoretic pixel, according to various example embodiments. These figures are top views of a portion of a TFT stack structure, such as 200 or 300, for example. Herein, unless otherwise stated, "conductive" means electrically conductive, and "connected" means electrically connected.

Figure 7:
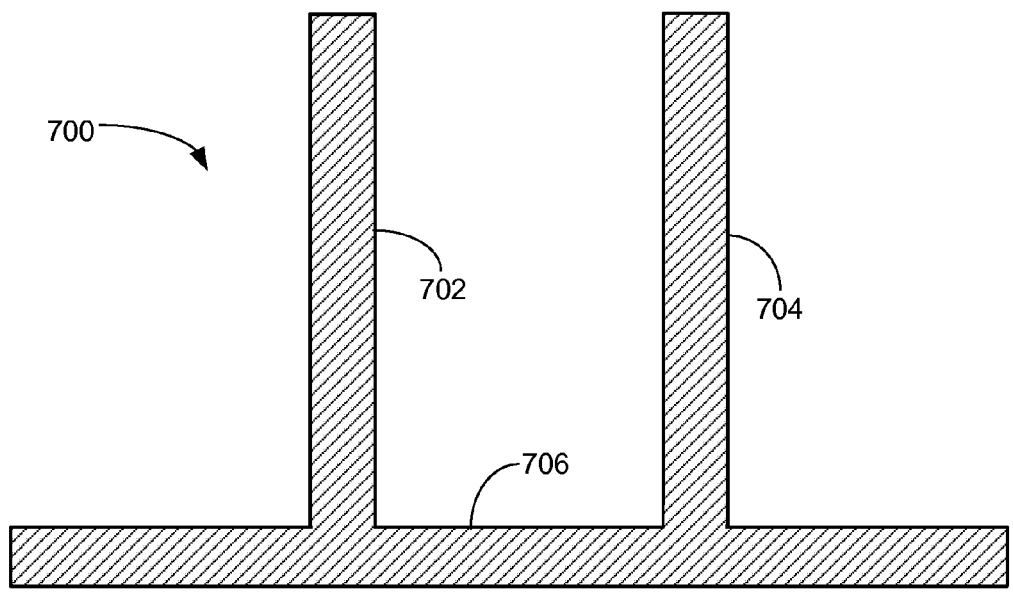
FIGS. 7-13 illustrate portions of an electrophoretic pixel at various stages of a process for fabricating the electrophoretic pixel, according to various example embodiments.

FIG. 7 illustrates a gate structure 700 for two TFT's. For example, the left-hand gate structure 702 may correspond to a gate (e.g., 202) of a first TFT (e.g., first TFT of TFT stack structure 200). The right-hand gate structure 704 may correspond to a gate (e.g., 204) of a second TFT (e.g., second TFT of TFT stack structure 200). Left-hand gate structure 702 and right-hand gate structure 704 may be interconnected by a portion of a gate line 706. The material for gate structure 700 may be any of a number of types of conductors, such as Mo, Al, Cr, Cu, Ti, or metal alloys, just to name a few examples.

An insulation material (not illustrated in FIG. 7), such as silicon nitride for example, may be deposited over structure 700. Such deposition may involve chemical vapor deposition (CVD) or sputtering, just to name a few examples.

Figure 8:
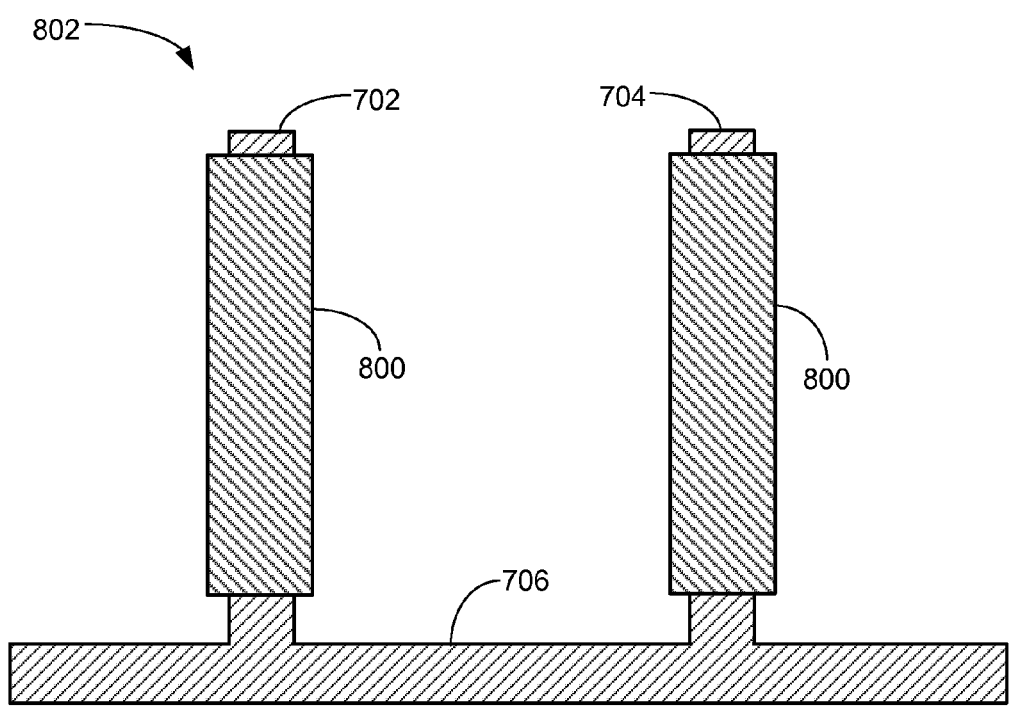

In FIG. 8, amorphous silicon 800 (a-Si) is deposited onto at least a portion of gate structure 700, thus forming structure 802. In some implementations, deposition may be performed using CVD or sputtering, just to name a few examples. "a-Si" is a substantially non-crystalline form of silicon, in contrast to polycrystalline silicon or monocrystalline silicon, for example. Claimed subject matter, however, is not limited to any particular form of silicon.

As illustrated in FIG. 8, a-Si 800 may be deposited so as to cover portions of left-hand gate structure 702 and right-hand gate structure 704 while leaving exposed gate line 706. In other implementations, a-Si 800 may cover less or more of left-hand gate structure 702 and right-hand gate structure 704 and may cover at least portions of gate line 706.

Figure 9:
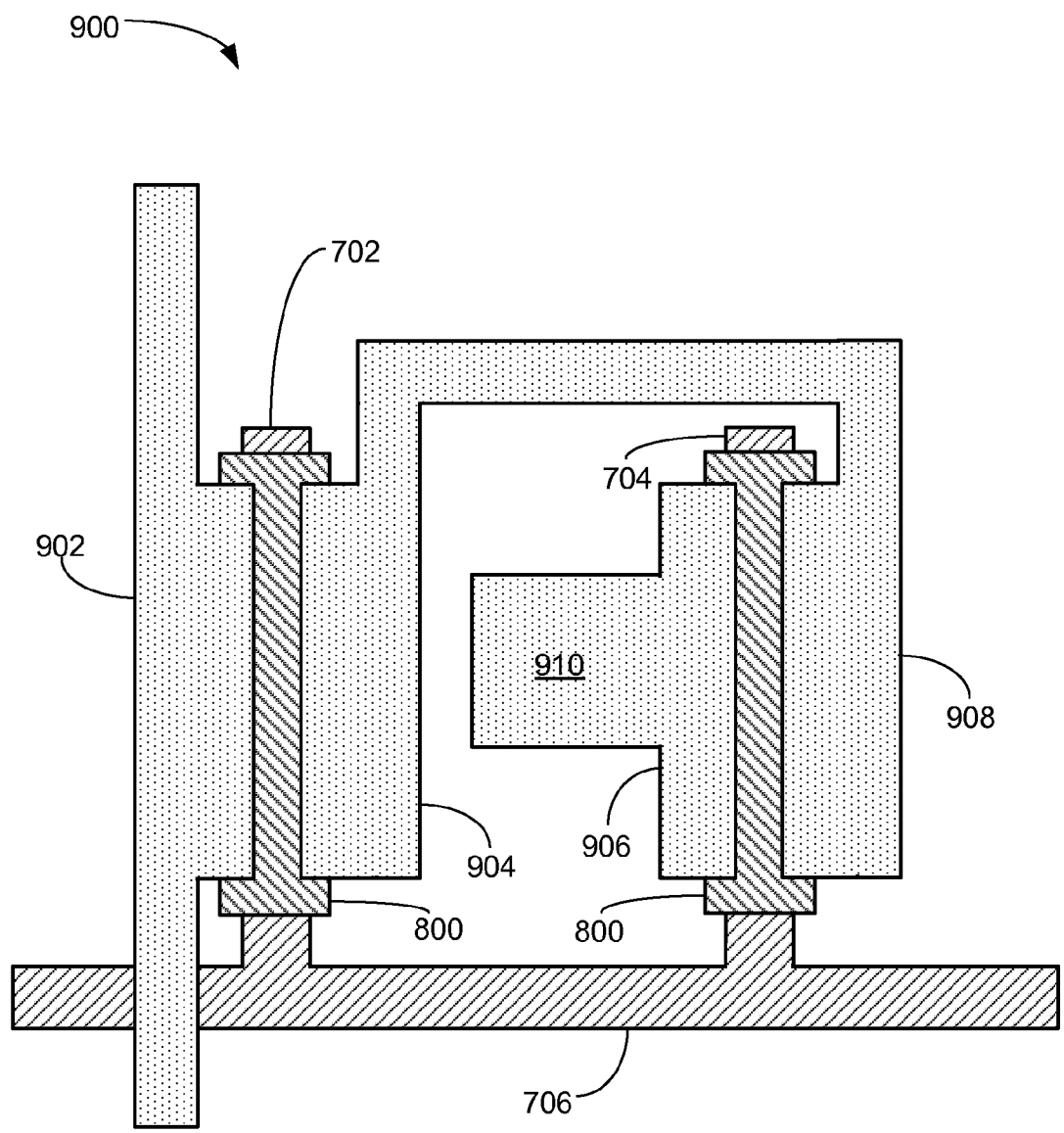

In FIG. 9, a drain layer (e.g., a layer that may act as either a drain or a source in the electrophoretic pixel) is formed by deposition via sputtering or other techniques. The drain layer may then be patterned and etched according to lithographic techniques to form individual sources and drains for the first and second TFTs, thus leading to structure 900. In particular, the drain layer is formed into a drain 902 for the first TFT, a source 904 for the first TFT, a drain 906 for the second TFT, and a source 908 for the second TFT. Source 904 and source 908 may comprise an interconnected structure (e.g., contiguous conductive material). For example, source 904 and source 908 may correspond to sources of TFTs 404 and 408, respectively, of FIG. 4. A contact region 910 may also be formed from the same process that forms the sources and drains. Contact region 910 and drain 906 may comprise an interconnected structure (e.g., contiguous conductive material).

Material of the drain layer may be any of a number of types of conducting materials. Generally, patterning may involve photolithography and optical masks to print patterns that guide deposition or removal of material from a substrate or underlying material at particular steps in the fabrication process. Accordingly, material is deposited or removed in those areas not covered by the mask and a new mask may be used for a subsequent layer. Generally, techniques for depositing material may include, for example, chemical vapor deposition, physical vapor deposition, molecular beam epitaxy, sputtering, and so on.

Figure 10:
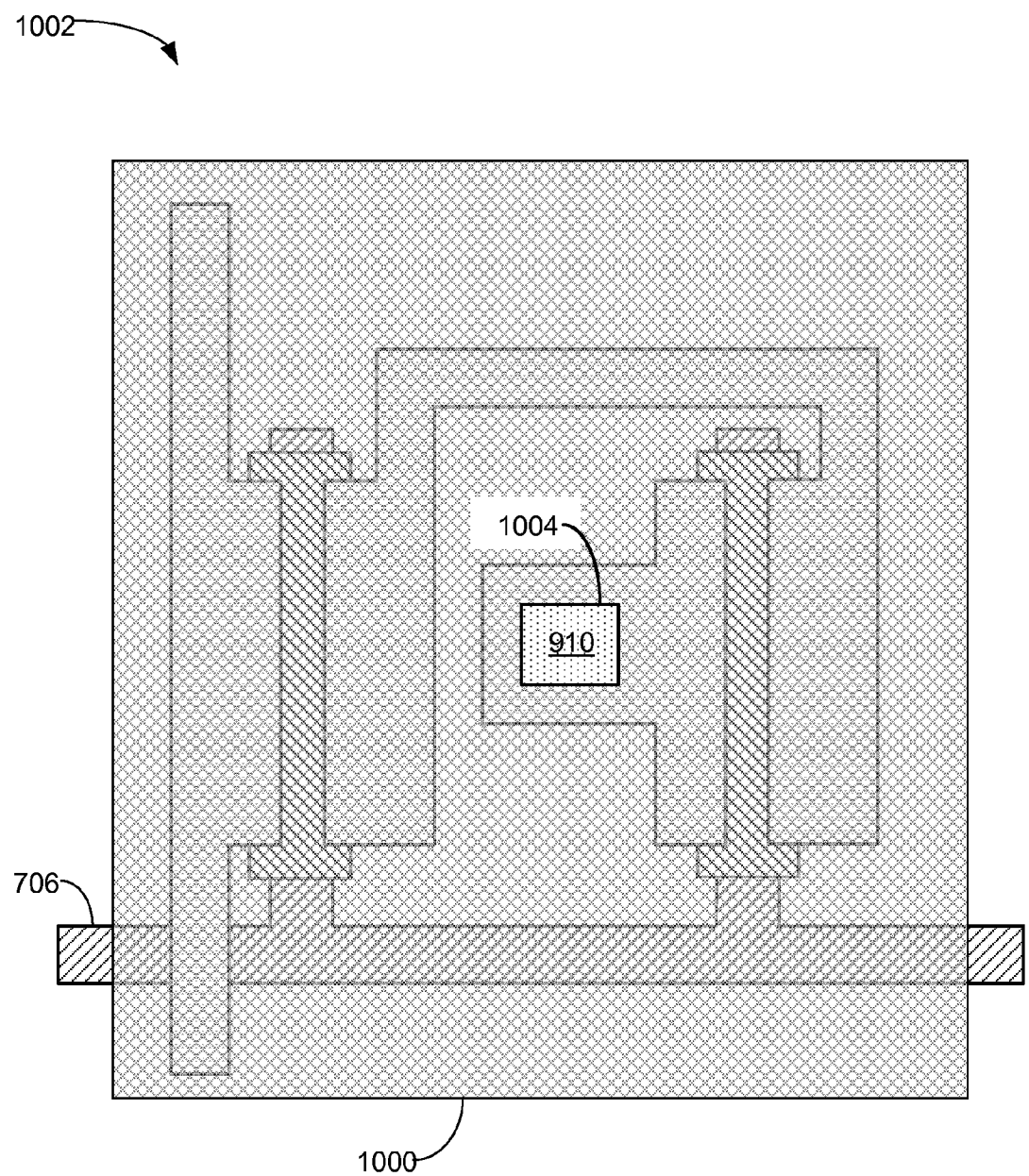

In FIG. 10, an organic material or photoresist material (e.g., such as SU8 or a JSR photoresist, just to name a few examples) or other insulating material layer 1000 may be formed (e.g., by deposition, masking and etching) on structure 900, leading to structure 1002. Layer 1000 may have a thickness in a range of approximately 1.5 to 2.5 microns. The pattern of layer 1000 includes a contact hole 1004 in a center region of the pixel. Contact hole 1004 exposes contact region 910, which is part of, or at least connected to, drain 906 of the second TFT. Contact hole 1004, which may be approximately several microns across, may have any of a number of shapes, such as round, rectangular, square and so on. Contact hole 1004 need not have the same shape or size as contact hole 222 or 322.

Figure 11:
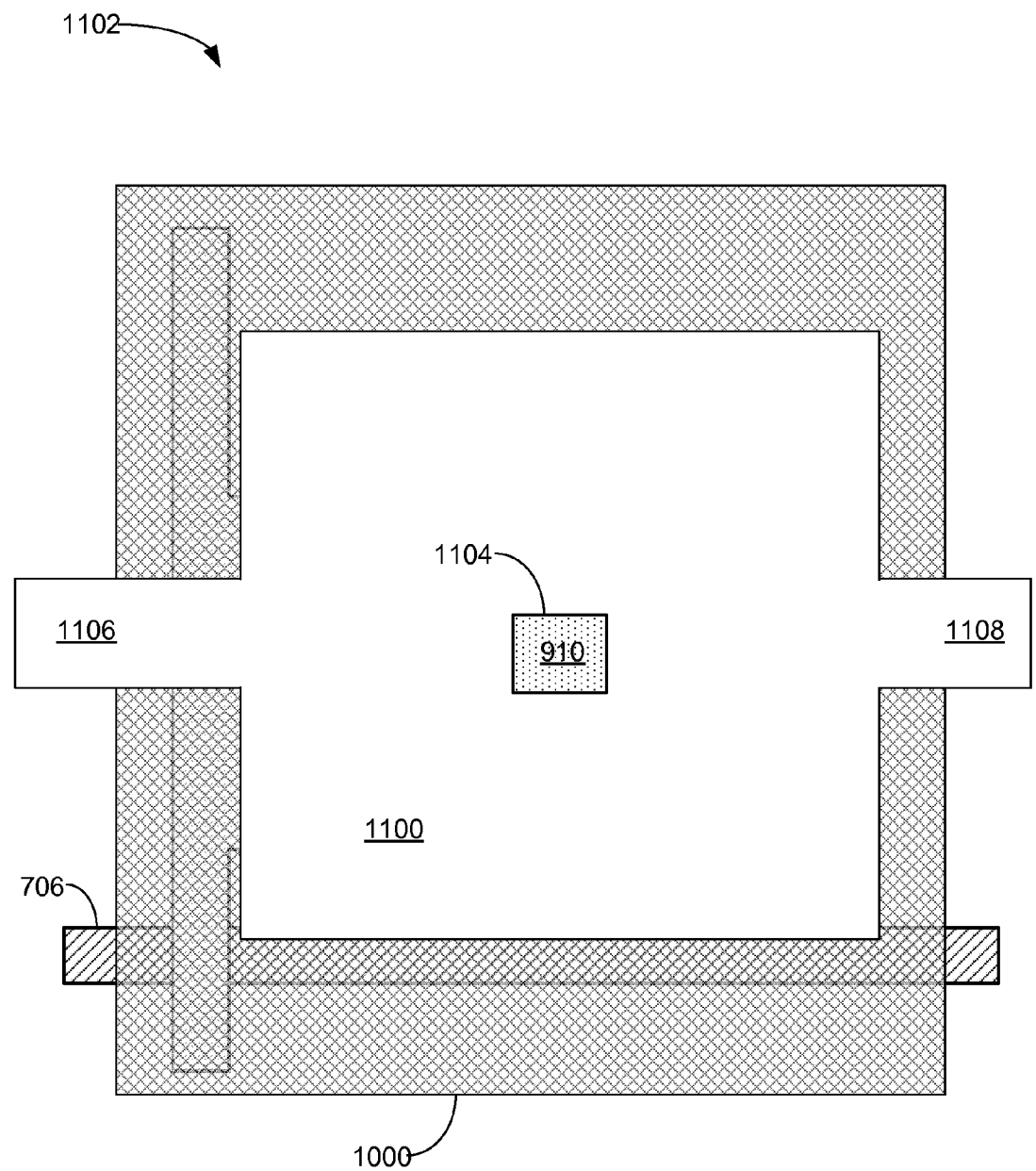

In FIG. 11, a conductive layer 1100 is formed (e.g., by deposition, patterning and etching, according to lithographic techniques) over at least a portion of structure 1002, leading to structure 1102. Conductive layer 1100 includes a contact hole 1104 in a center region of the pixel and substantially overlying contact hole 1004. Contact hole 1104 exposes contact region 910. Contact hole 1104, which may be approximately several microns across, may have any of a number of shapes, such as round, rectangular, square and so on. Contact hole 1104 need not have the same shape or size as contact hole 222, 322, or 1004. Conductive layer 1100 may correspond to a common electrode, such as 226 in FIG. 2, or M4 illustrated in FIG. 4. Conductive layer 1100 may comprise a metal or other conductive material.

Portions 1106 and 1108 of conductive layer 1100 may extend into various portions of circuitry for operating the electrophoretic pixel. For example, portion 1106 may be electrically connected to portion 1108 of a neighboring pixel. Portion 1108 may be electrically connected with a voltage ground point, such as SCgnd, also illustrated in FIG. 4.

Figure 12:
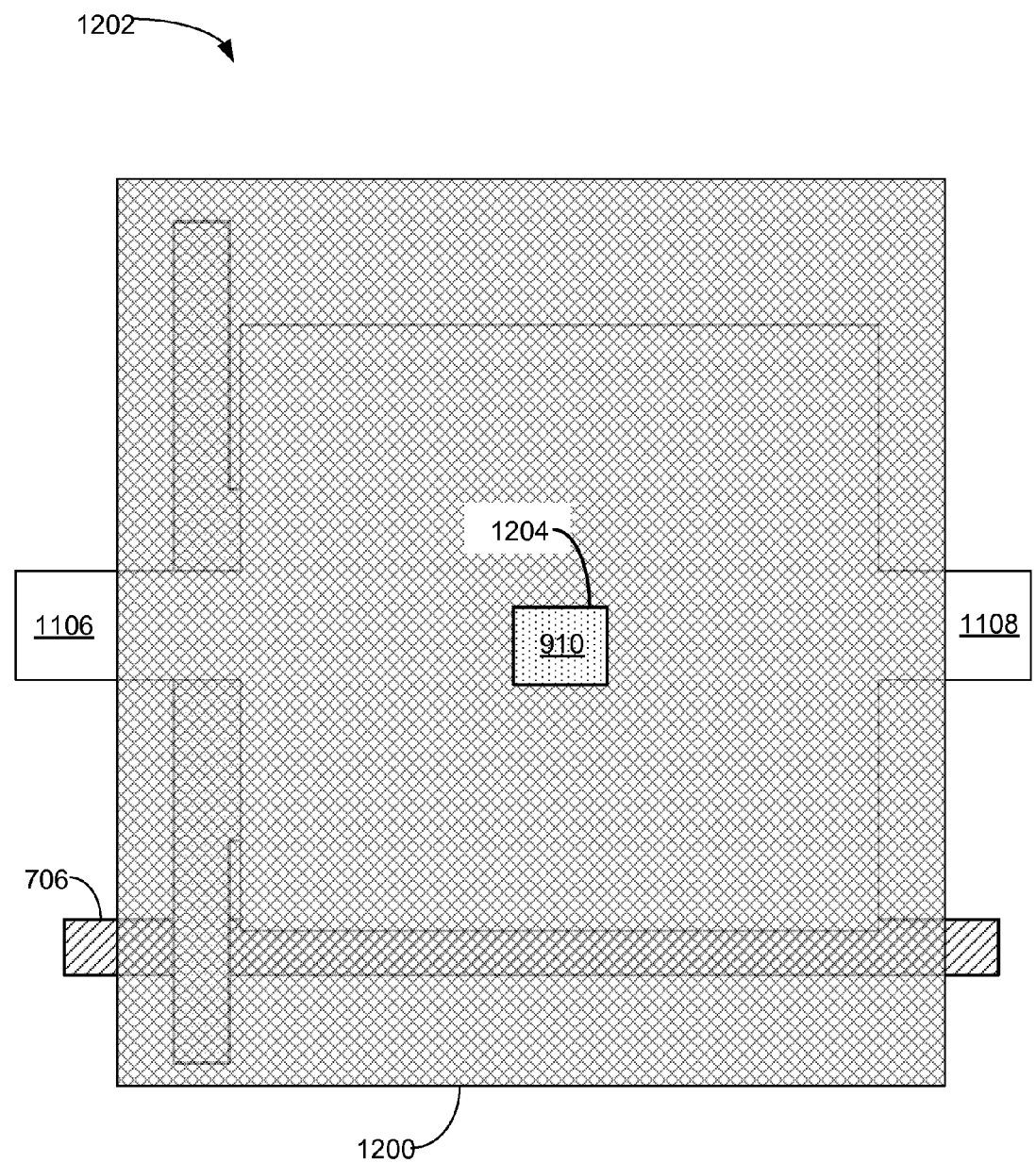

In FIG. 12, a dielectric layer 1200 may be formed (e.g., by deposition, masking and etching) on structure 1102, leading to structure 1202. Dielectric layer 1200, which may be a few hundred nanometers thick, may comprise silicon nitride or other material having substantially similar dielectric properties. The pattern of silicon nitride layer 1200 includes a contact hole 1204 in a center region of the pixel and substantially overlying contact holes 1104 and 1004. Contact hole 1204 exposes contact region 910. Contact hole 1204, which may be approximately several microns across, may have any of a number of shapes, such as round, rectangular, square and so on. Contact hole 1204 need not have the same shape or size as contact hole 222, 322, 1004, or 1104.

Figure 13:
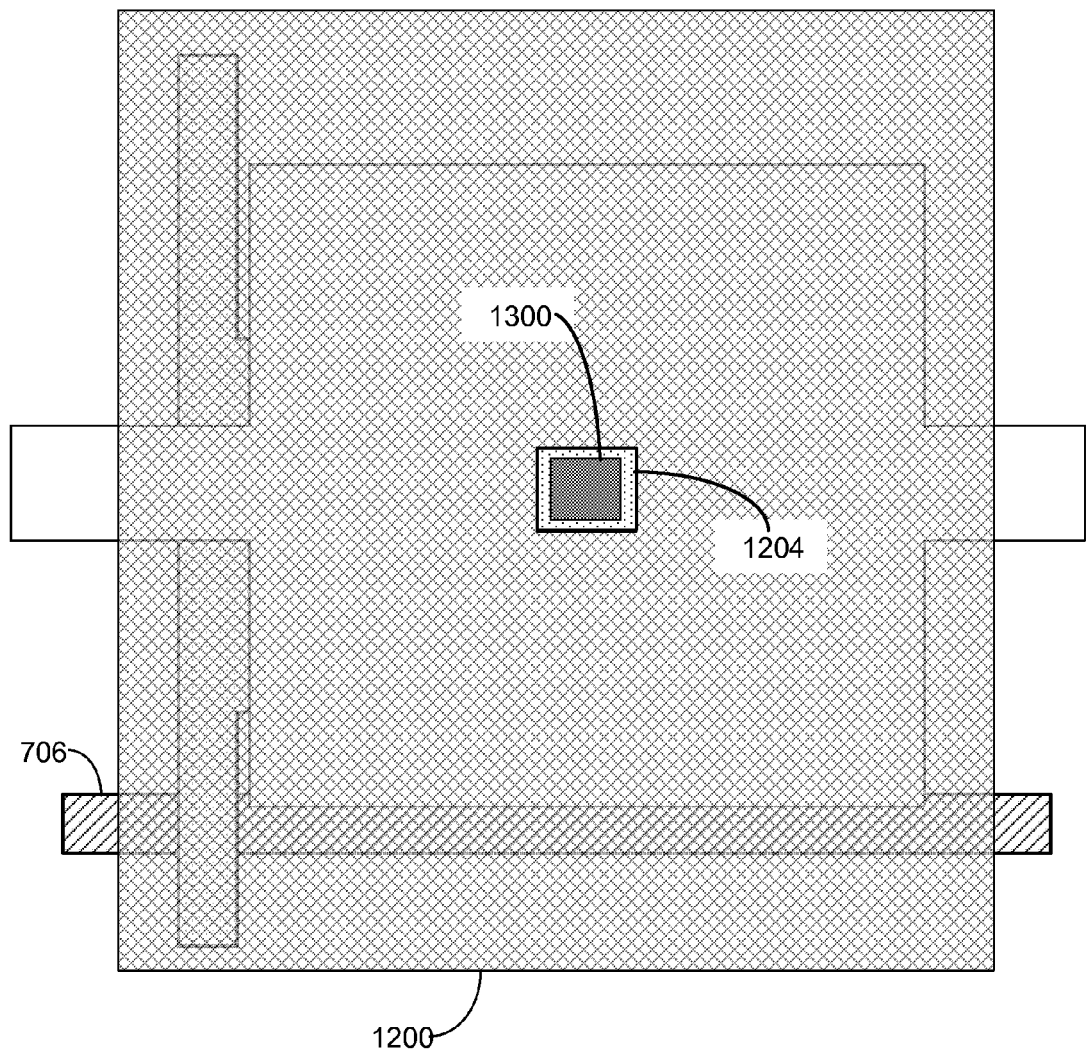

In FIG. 13, a pixel electrode 1300 is formed on dielectric layer 1200. Pixel electrode 1300 extends over a substantial portion (if not all of) dielectric layer 1200. Material of the pixel electrode additionally at least partially fills contact holes 1004, 1104, and 1204 (all corresponding to contact holes 222 or 322 in FIGS. 2 and 3, respectively). Thus, pixel electrode 1300 is connected to drain 906 via the contact holes, which are at least partially filled with conductive material, and contact region 910. Pixel electrode 1300 may correspond to 230 in FIG. 2, or M3 illustrated in FIG. 4. Pixel electrode 1300 may comprise a metal or other conductive material.

In some embodiments, pixel electrode 1300 covers a portion of dielectric layer 1200 so that pixel electrode 1300 covers an area over gate structure 700. For example, pixel electrode 1300 may be approximately 20-30 microns across, just to describe one particular implementation. Pixel electrode 1300 may be several hundred nanometers thick.

Figure 14:
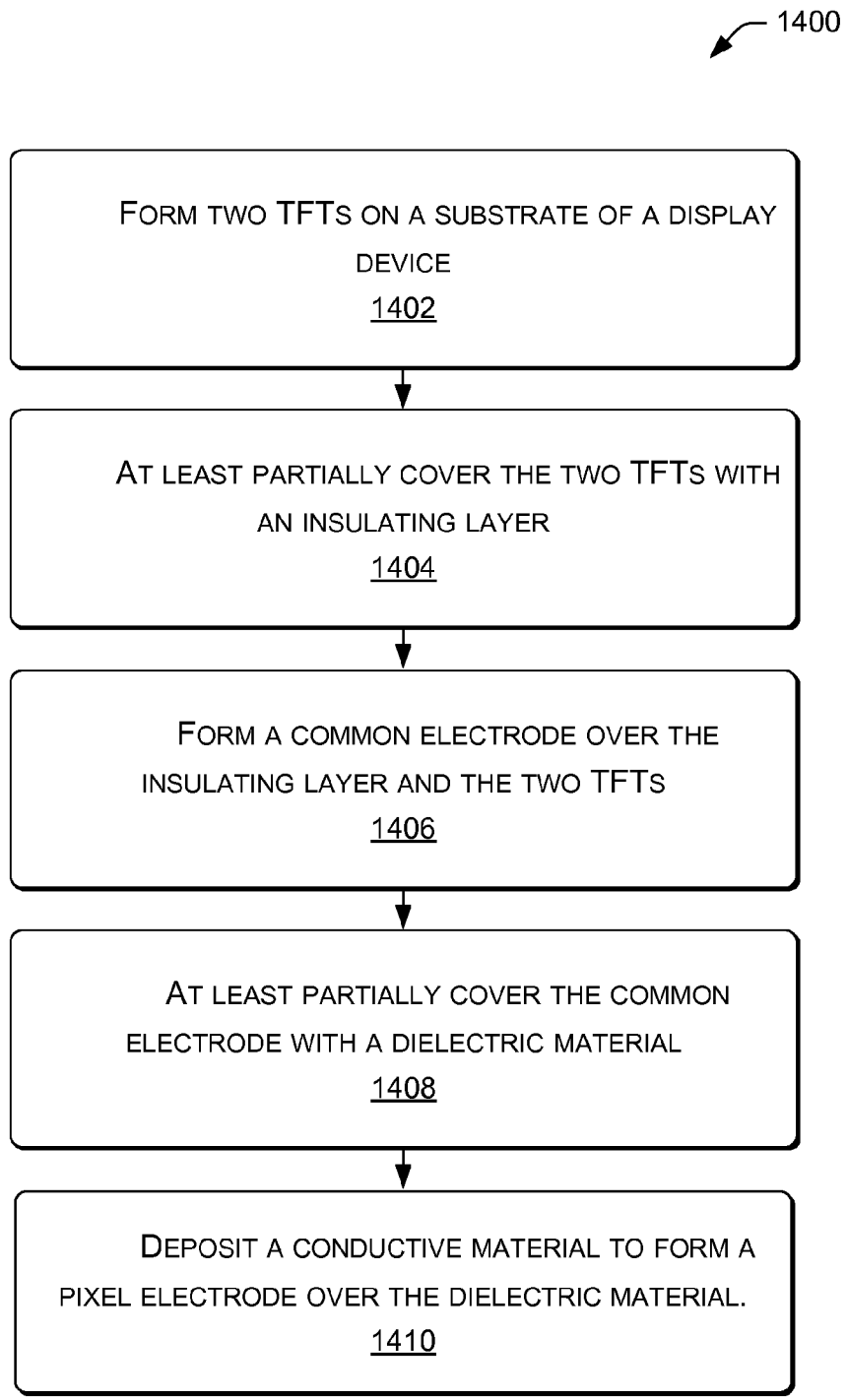
FIG. 14 is a flow diagram of a process for fabricating a portion of an electrophoretic pixel, according to various example embodiments.

FIG. 14 is a flow diagram of a process 1400 for fabricating a portion of an electrophoretic pixel, according to various example embodiments. Process 1400 may be similar to or the same as at least portions of the fabricating process examples illustrated in FIGS. 7-13, for example. At block 1402, a fabricator may form two TFTs on a substrate of a display device. In some implementations, the two TFTs may be used to operate a single pixel of a display device (e.g., another pixel of the display device may be operated by another two TFTs, and so on). At block 1404, the fabricator may at least partially cover the two TFTs with an insulating layer, which may comprise an organic material, for example. At block 1406, the fabricator may form a common electrode over the insulating layer and the two TFTs. Such a common electrode may be an electrode that provides common potential (common voltage) to a plurality of pixels of the display device, for example. At block 1408, the fabricator may at least partially cover the common electrode with a dielectric material (e.g., which may also be substantially an insulator). At block 1410, the fabricator may deposit a conductive material to form a pixel electrode over the dielectric material. The pixel electrode may be an electrode of individual, respective pixels, wherein the electrode provides signal potential (signal voltage) to the medium between a pixel electrode and a common electrode, for example.

Figure 15:
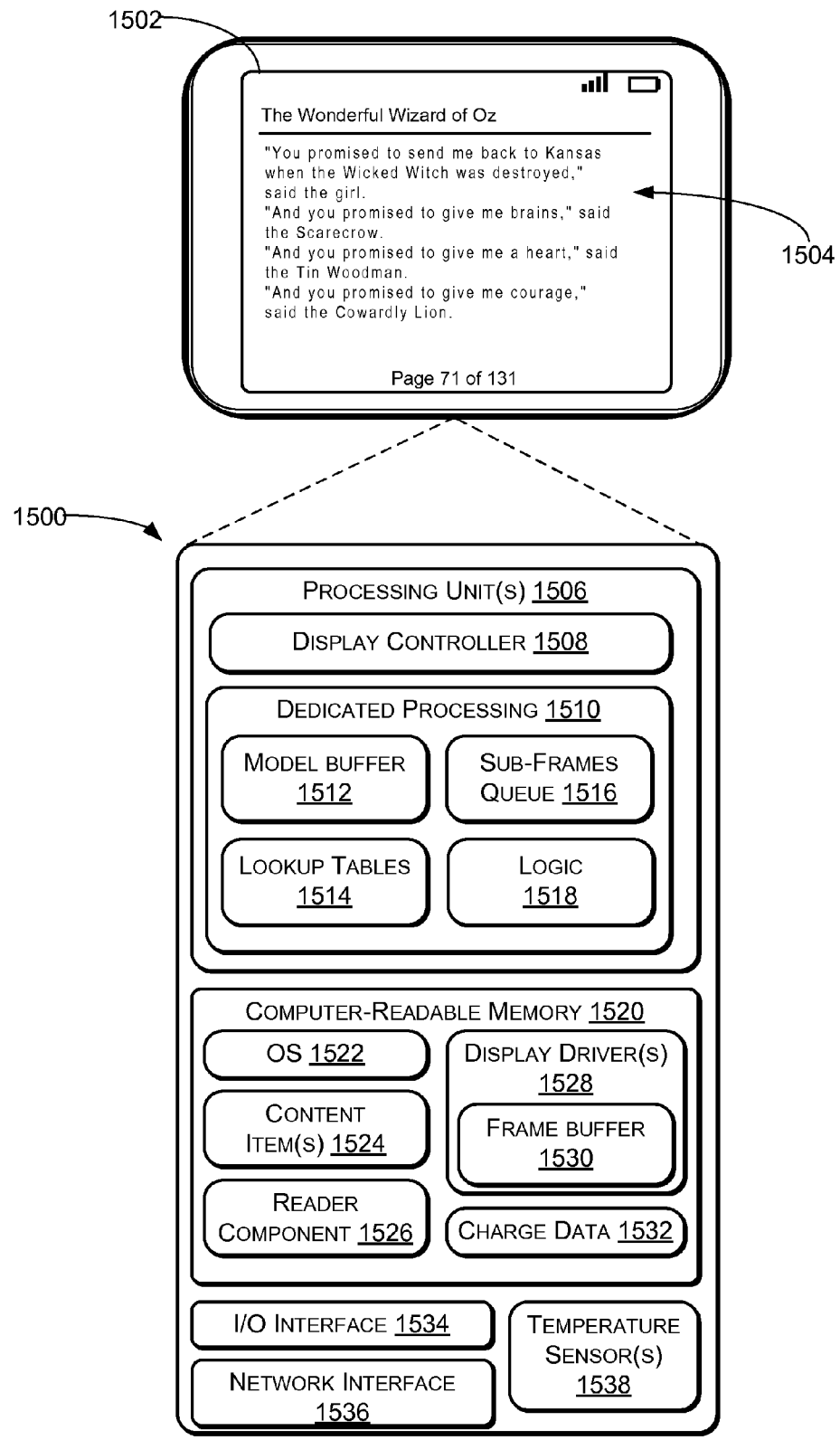
FIG. 15 depicts an example computing device which may perform operations for dynamically updating an electrophoretic display, according to embodiments.

FIG. 15 depicts an example computing device 1500 that may implement various embodiments described herein. For example, computing device 1500 may depicts an electronic book (eBook) reader, tablet, or other computing device that employs an electrophoretic display, or other type of display. In the example shown in FIG. 15, computing device 1500 is an eBook reader that includes an electrophoretic display 1502, shown displaying a portion 1504 of a content item, in this example "The Wonderful Wizard of Oz" by L. Frank Baum. In this example, the display 1502 is an electrophoretic display that includes a plurality of microcapsules filled with charged pigment particles, each microcapsule providing a pixel of a displayed image. As used herein, the term pixel may refer to the displayed pixel of an image or may refer to the microcapsule with a charge state that determines a color or brightness state of a corresponding pixel in the display.

Computing device 1500 may include one or more processing units 1506 (e.g., processors) which may be implemented as hardware, software, or some combination thereof. Processing unit(s) 1506 may execute computer-executable, processor-executable, and/or machine-executable instructions written in any suitable programming language to perform various functions described herein. In some embodiments, processing unit(s) 1506 include one or more System on Chips (SOCs), such as the Open Multimedia Applications Platform (OMAP) system developed by Texas Instruments®. In some embodiments, processing unit(s) 1506 include an OMAP 3 processor.

In addition to a main processor, processing unit(s) 1506 may also include a display controller 1508 (e.g., the same as or similar to controller 508, illustrated in FIG. 5) and dedicated processing 1510. The dedicated processing 1510 may be a digital signal processor (DSP), a graphic processing unit, a single- or multi-core central processing unit (CPU), or hard-coded logic (e.g., hard-coded in silicon). In some embodiments, the display controller 1508 operates to send information to the display describing the frames (or sub-frames) to be displayed. Although display controller 1508 and dedicated processing 1510 are shown as hardware components of the processing unit(s) 1506, in some embodiments these components may be implemented at least in part as software (e.g., as part of the operating system or other firmware on computing device 1500).

In the example shown, dedicated processing 1510 includes a model buffer 1512, lookup tables 1514, sub-frames queue 1516, and logic 1518. In some embodiments, model buffer 1512 stores data describing a modeled current state of each pixel in the display 1502, where the modeled current state is a prediction of the current color state of a pixel based on previously known state(s) of the pixel and/or voltage(s) previously applied to the pixel to change its state. Lookup tables 1514 may store information mapping a current pixel state to a result pixel state based on various voltages applied to the current state. Sub-frames queue 1516 may store data for one or more sub-frames to be provided to the display during a time period to display a frame. Logic 1518 includes software logic (e.g., instructions) to perform various operations described herein, such as updating the model buffer 1512 based on voltage(s) applied to pixels of the display.

As shown, computing device 1500 may also include a computer-readable memory 1520, which may include volatile memory such as random access memory (RAM), static random access memory (SRAM), dynamic random access memory (DRAM), cache memory, and the like. In some embodiments, computer-readable memory 1520 includes one or more operating systems (OS) 1522, and one or more processes including components, programs, or applications that are loadable and executable by processing unit(s) 1506. Computer-readable memory 1520 may also store one or more files, tables, databases, and/or other data structures. In the example shown, computer-readable memory 1520 includes one or more content items 1524 such as eBook content files, and a reader component 1526, e.g., a program that reads and interprets content item(s) 1524 for display.

Computer-readable memory 1520 may also include one or more display driver(s) 1528, each of which may include a frame buffer 1530. Although the frame buffer 1530 is depicted as part of the display driver(s) 1528, embodiments are not so limited. For example, in some embodiments the frame buffer 1530 may be a separate component from display driver(s) 1528 in computer-readable memory 1520. In some embodiments, computer-readable memory 1520 may also include charge data 1532, describing a current accumulated charge for one or more pixels of the display 1502.

Computer-readable memory 1520 may include non-removable and/or removable storage, such as a hard drive, magnetic disk storage, optical disk storage, tape storage, storage arrays, storage area networks, network attached storage, cloud storage, and the like. Thus, computer-readable media 1520 may provide volatile and/or non-volatile storage of computer readable instructions, data structures, program modules, and other data for the operation of computing device 1500.

As used herein, computer-readable media may include two distinct types of media: storage media and communications media. With regard to storage media, embodiments may be provided as a computer program product stored on a non-transitory computer-readable or machine-readable storage medium. Computer-readable or machine-readable storage media includes tangible and/or non-transitory forms of media such as volatile and/or non-volatile memory. Such media may be included in a device and/or hardware component that is part of a device or external to a device, including but not limited to random-access memory (RAM), SRAM, DRAM, read-only memory (ROM), erasable programmable read-only memory (EPROM), electrically erasable programmable read-only memory (EEPROM), flash memory, compact disc read-only memory (CD-ROM), digital versatile disks (DVDs), optical cards or other optical storage media, magnetic cassettes, magnetic tape, magnetic disk storage, magnetic cards or other magnetic storage devices or media, solid-state memory devices, or any other non-transmission memory, device, and/or medium that can be used to store and maintain information for access by a computing device. Computer storage media may store information in the form of instruction sets, data structures, applications, program modules and the like, that may be used to program a computing device or processor and thus enable a computing device or processor to perform actions. The stored information may be stored in a compressed or uncompressed form.

In contrast to the tangible storage media described above, communication media is non-tangible (e.g., transitory) and may include data (e.g., computer instruction sets, data structures, program modules, and the like) transmitted in a modulated data signal such as a carrier wave. Embodiments may also be provided as a computer program product including a transitory machine-readable signal (in compressed or uncompressed form). Examples of machine-readable signals, whether modulated using a carrier or not, include but are not limited to signals that a computer system or machine hosting or running a computer program can be configured to access, including signals downloaded through the Internet or other networks. For example, distribution of software may be via Internet download. Thus, tangible computer storage media does not include non-tangible communication media.

Computing device 1500 may further include one or more input/output (I/O) interfaces 1534 to allow computing device 1500 to communicate with other devices such as user input peripheral devices (e.g., a keyboard, a mouse, a pen, a game controller, a voice input device, a touch input device, gestural input device, and the like), and/or output peripheral devices (e.g., a display, a printer, audio speakers, a haptic output, and the like). Computing device 1500 may also include one or more network interfaces 1536 to enable communications between computing device 1500 and other networked devices. Such network interfaces 1536 may include one or more network interface controllers (NICs) or other type of transceiver device to send and receive communications over a network.

Further, computing device 1500 may also include one or more temperature sensors 1538 to measure a current temperature of computing device 1500 and/or one or more components of computing device 1500. Moreover, although not depicted in FIG. 15, computing device 1500 may also include one or more busses and/or other internal communications hardware or software that allow for the transfer of data and/or internal communications between the various components of computing device 1500.

In some embodiments, a process flow for sending data for display on display 1502 may proceed as follows. First, processing unit(s) 1506 may write a frame to be displayed into frame buffer 1530, based on information received from reader component 1526 processing a content item 1524. The dedicated processing 1510 may access and/or read the frame buffer 1530, and based on the logic 1518, the model buffer 1512, and/or lookup tables 1514, determine one or more sub-frames to write into the sub-frames queue 1516. This determination may be based on a determination of voltage(s)

that optimally move the state of each pixel toward a target state to display the frame in the display, as described further herein. In some embodiments, a queue of at least four sub-frames may be kept in sub-frames queue 1516 to prevent delay in processing. The display controller 1508 may read each sub-frame out of the queue and send it on to the display. In this way, the display controller 1508 may manage the timing of sending sub-frames to the display.

Figure 16:
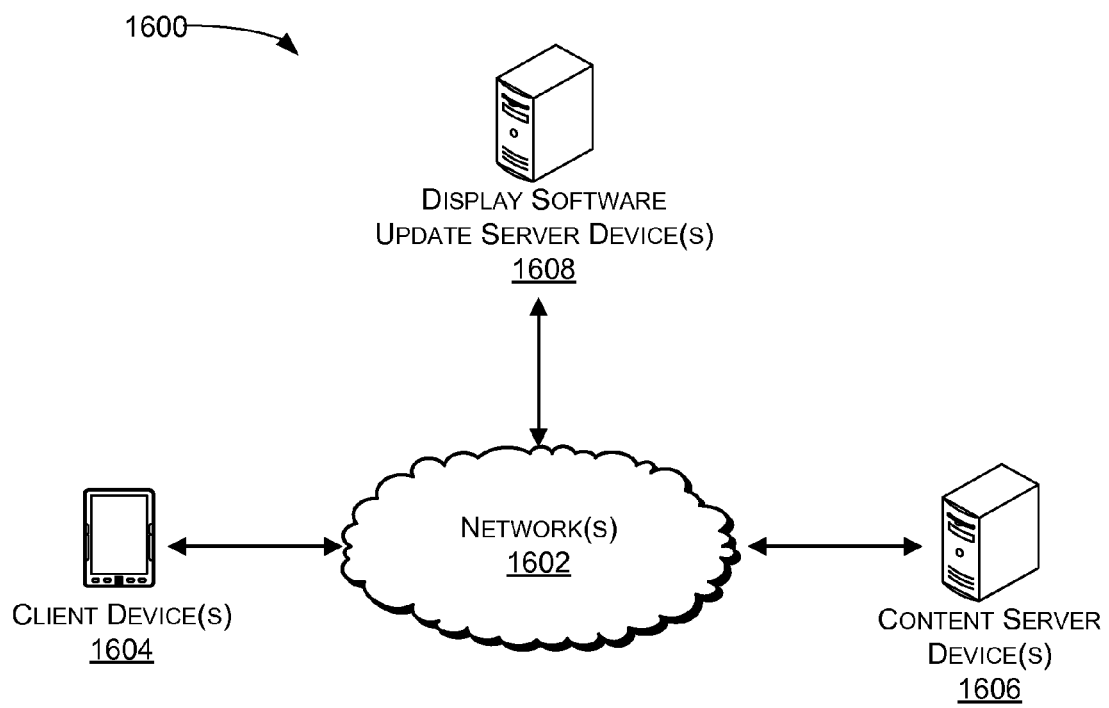
FIG. 16 depicts a diagram of an example environment in which embodiments may operate.

FIG. 16 shows an example environment 1600 in which embodiments may operate. In embodiments, the various devices and/or components of environment 1600 may communicate with one another and with external devices via one or more networks 1602. For example, networks 1602 may include public networks such as the Internet, private networks such as an institutional and/or personal intranet, or some combination of private and public networks. Networks 1602 may also include any type of wired and/or wireless network, including but not limited to local area networks (LANs), wide area networks (WANs), Wi-Fi, WiMax, and mobile communications networks (e.g. 3G, 4G, and so forth). Networks 1602 may utilize communications protocols, including packet-based and/or datagram-based protocols such as internet protocol (IP), transmission control protocol (TCP), user datagram protocol (UDP), or other types of protocols. Moreover, networks 1602 may also include a number of devices that facilitate network communications and/or form a hardware basis for the networks, such as switches, routers, gateways, access points, firewalls, base stations, repeaters, backbone devices, and the like.

In some embodiments, environment 1600 includes one or more client devices 1604, such as the computing device 1500 shown in FIG. 15. In one example, client device(s) 1604 may include eBook readers or other devices that incorporate an electrophoretic display to display information. However, embodiments are not limited to a particular type of client device, and client device(s) 1604 may include any type of computing device that is able to display information, including but not limited to desktop computers, personal computers, laptop computers, tablet computers, eBook readers, wearable computers, mobile phones, automotive computers, thin clients, terminals, personal data assistants (PDAs), game consoles, mobile gaming devices, and the like.

In some embodiments, environment 1600 includes one or more server computing devices such as content server device(s) 1606 and display software update server device(s) 1608. Such server devices may include any type of computing device including, but not limited to, network servers, workstations, desktop computers, laptop computers, tablet computers, mobile computing devices, and the like. Further, the server devices shown may include one or more computing devices that operate in a cluster or other grouped configuration to share resources, balance load, increase performance, provide fail-over support or redundancy, or for other purposes.

In some embodiments, content server device(s) 1606 include one or more hardware and/or software components for an e-commerce service, content provision service, or other services to provide content to be displayed on client device(s) 1604. For example, content item(s) 1524 may be purchased from or otherwise provided by a web site hosted by content server device(s) 1606. In some embodiments, environment 1600 may also include one or more display software update server device(s) 1608 to provide initial installations and/or updates of display software for client device(s) 1604. For example, in some embodiments one or more components (e.g., lookup tables 1514, logic 1518, and/or other components) of computing device 1500 may be software components stored in memory (e.g., computer-readable media 1520) instead of hardware components of processing unit(s) 1506. In such cases, display software update server device(s) 1608 may provide software updates to client device(s) 1604 to improve display software performance, fix bugs, update software to support different file formats or display formats, and so forth.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A method for fabricating a portion of a pixel of a display, the method comprising:

forming a gate structure for at least two thin film transistors (TFTs) of the pixel;

forming an amorphous silicon layer on at least a portion of the gate structure;

forming a drain layer over at least a portion of (i) the gate structure and (ii) the amorphous silicon layer, wherein the drain layer includes a central conductive region that is, in a plan view, proximate to a middle of the drain layer;

forming an insulating layer to substantially cover the gate structure, the amorphous silicon layer, and the drain layer, wherein the insulating layer includes an opening substantially above the central conductive region;

forming a common electrode layer over the insulating layer, wherein the common electrode layer includes an opening substantially above the central conductive region;

forming a silicon nitride layer on the common electrode layer, wherein the silicon nitride layer includes an opening substantially above the central conductive region; and forming a pixel electrode on the silicon nitride layer, wherein at least a portion of the pixel electrode is (1) disposed in the opening of the insulating layer, the opening of the common electrode layer, and the opening of the silicon nitride layer, and (ii) in electrical contact with the central conductive region.

2. The method of claim 1, wherein forming the gate structure for the at least two TFT's of the pixel comprises:

depositing a conductive material on a substrate; and patterning the conductive material so that the conductive material includes a first gate and a second gate for each of the at least two TFTs, respectively, wherein the first gate and the second gate connect to one another by a portion of a gate line, wherein the first gate, the second gate, and the portion of the gate line are substantially in the same plane as the drain layer.

3. The method of claim 1, wherein forming the drain layer comprises:

depositing a conductive material on the amorphous silicon layer; and patterning the conductive material so that the conductive material includes the central conductive region and a drain for one of the at least two TFTs, wherein the drain and the central conductive region comprise a single contiguous portion of the conductive material.

4. A method for fabricating a stacked thin film transistor (TFT) structure, the method comprising:

forming at least two TFTs on a substrate of a display device;

at least partially covering the at least two TFTs with an insulating layer;

forming a common electrode on the insulating layer and the at least two TFTs;

covering, at least partially, the common electrode with a dielectric material, wherein the insulating layer, the common electrode, and the dielectric material each include a contact hole;

filling, at least partially, the contact hole with a conductive material; and depositing the conductive material over the dielectric material to form a pixel electrode.

5. The method of claim 4, further comprising:

patterning a conductive layer to form sources and drains for the at least two TFTs and a contact region between a first TFT of the at least two TFTs and second TFT of the at least two TFTs.

6. The method of claim 5, further comprising forming a contact hole in each of the insulating layer, the common electrode, and the dielectric material; and filling, at least partially, the contact hole of each of the insulating layer, the common electrode, and the dielectric material with a portion of the conductive material so that the pixel electrode is in electrical contact with a drain of at least one of the at least two TFTs.

7. The method of claim 4, wherein forming the at least two TFTs on the substrate of the display device further comprises:

forming a conductive layer that includes a first gate for one of the at least two TFTs and a second gate for the other one of the at least two TFTs;

at least partially covering the first and second gates with a second insulating layer; and patterning a second conductive layer to form sources and drains for the at least two TFTs.

8. The method of claim 4, further comprising forming a storage capacitor for a pixel of the display device by forming the common electrode, at least partially covering the common electrode with the dielectric material, and depositing the conductive material.

9. The method of claim 4, further comprising laminating the stacked TFT structure to an electrophoretic display device or an electrowetting display device.

10. A device comprising:

a thin film transistor (TFT) structure that includes:

two TFT's serially connected to one another and disposed substantially in a first plane;

a conductive contact region disposed (i) between the two TFTs and (ii) substantially in the first plane;

a capacitor disposed substantially in a second plane that is over the two TFTs;

an insulation layer between (i) the two TFTs and (ii) the capacitor, wherein the insulation layer includes a contact hole extending from a portion of the capacitor to the conductive contact region; and a conductive material at least partially filling the contact hole in the insulation layer.

11. The device of claim 10, wherein the contact hole is located between the two TFTs in a top view of the TFT structure.

12. The device of claim 10, wherein the capacitor includes the contact hole.

13. The device of claim 10, wherein the device comprises a display device, and wherein the capacitor further comprises:

a common electrode electrically connected to a plurality of pixels of the display device;

a pixel electrode electrically connected to a single pixel of the display device; and a dielectric layer between the common electrode and the pixel electrode.

14. The device of claim 13, wherein the common electrode and the dielectric layer each include a contact hole that is at least partially filled with the conductive material.

15. The device of claim 10, wherein the conductive contact region includes a portion of a drain of one of the two TFTs.

16. The device of claim 10, wherein the conductive contact region includes portions of drains of each of the two TFTs.

17. The device of claim 10, further comprising liquid crystal material electrically connected to the TFT structure.

18. The device of claim 10, further comprising electrophoretic microcapsules electrically connected to the TFT structure.

19. The device of claim 10, further comprising electrowetting material electrically connected to the TFT structure.

20. The device of claim 10, wherein the conductive material at least partially filling the contact hole in the insulation layer comprises a via that electrically connects the conductive contact region to the capacitor.

* * * * *